(12) United States Patent
Elshurafa et al.

(10) Patent No.: US 9,614,024 B2
(45) Date of Patent: Apr. 4, 2017

(54) FRACTAL STRUCTURES FOR MEMS VARIABLE CAPACITORS

(75) Inventors: Amro M. Elshurafa, Thuwal (SA); Ahmed Gomaa Ahmed Radwan, Thuwal (SA); Ahmed A. Emira, Mission Viejo, CA (US); Khaled Nabil Salama, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 425 days.

(21) Appl. No.: 14/239,346

(22) PCT Filed: Aug. 21, 2012

(86) PCT No.: PCT/US2012/051733
§ 371 (c)(1),
(2), (4) Date: May 8, 2014

(87) PCT Pub. No.: WO2013/028696
PCT Pub. Date: Feb. 28, 2013

(65) Prior Publication Data
US 2014/0240894 A1  Aug. 28, 2014

Related U.S. Application Data

(60) Provisional application No. 61/527,237, filed on Aug. 25, 2011.

(51) Int. Cl.
*H01G 5/00* (2006.01)
*H01G 7/00* (2006.01)
*H01L 49/02* (2006.01)
*H01G 5/18* (2006.01)
*H01G 5/16* (2006.01)
*H01G 13/00* (2013.01)

(52) U.S. Cl.
CPC .............. *H01L 28/40* (2013.01); *H01G 5/16* (2013.01); *H01G 5/18* (2013.01); *H01G 7/00* (2013.01); *H01G 13/00* (2013.01); *H01L 28/86* (2013.01); *Y10T 29/43* (2015.01)

(58) Field of Classification Search
CPC ................................ H01G 5/011; H01G 5/16
USPC ................................. 361/277, 281; 29/25.42
See application file for complete search history.

(56) References Cited

U.S. PATENT DOCUMENTS

| | | | | |
|---|---|---|---|---|
| 6,028,990 A | * | 2/2000 | Shahani | H01L 27/0805 257/301 |
| 6,084,285 A | * | 7/2000 | Shahani | H01L 27/0805 257/532 |
| 6,897,537 B2 | | 5/2005 | De Los Santos | |

(Continued)

OTHER PUBLICATIONS

International Search Report Application No. PCT/US2012/051733 dated Jan. 25, 2013, 1 page.

*Primary Examiner* — Eric Thomas
(74) *Attorney, Agent, or Firm* — Thomas | Horstemeyer, LLP

(57) ABSTRACT

In accordance with the present disclosure, one embodiment of a fractal variable capacitor comprises a capacitor body in a microelectromechanical system (MEMS) structure, wherein the capacitor body has an upper first metal plate with a fractal shape separated by a vertical distance from a lower first metal plate with a complementary fractal shape; and a substrate above which the capacitor body is suspended.

20 Claims, 11 Drawing Sheets

(56) References Cited

U.S. PATENT DOCUMENTS

| | | |
|---|---|---|
| 6,980,412 B2 | 12/2005 | Cheng et al. |
| 7,009,832 B1 * | 3/2006 | Chen .................. H01G 4/228 257/306 |
| 2004/0214543 A1 | 10/2004 | Osone et al. |
| 2005/0041368 A1 | 2/2005 | Togashi |
| 2009/0206963 A1 | 8/2009 | Nguyen et al. |
| 2009/0223288 A1 | 9/2009 | Veerasamy |
| 2010/0055507 A1 | 3/2010 | Morand |

* cited by examiner

FRACTAL STRUCTURES FOR MEMS VARIABLE CAPACITORS

CROSS-REFERENCE TO RELATED APPLICATIONS

This application is the National Stage of International Application No. PCT/US2012/051733, filed Aug. 21, 2012, which claims the benefit of and priority to U.S. provisional application to 61/527,237, filed Aug. 25, 2011, the contents of all of which are incorporated by reference as if fully set forth herein.

TECHNICAL FIELD

The present disclosure discloses embodiments of microelectromechanical system (MEMS) variable fractal capacitors.

BACKGROUND

In addition to microelectromechanical system (MEMS) fixed or static fractal capacitors, fractal capacitors may be advantageously utilized with MEMS variable capacitors. MEMS variable capacitors have been researched for nearly 15 years. With respect to electrostatically actuated MEMS variable capacitors specifically, there are two main types of structures, namely the parallel plate type and the comb drive type.

The parallel plate type provides a theoretical maximum tuning range of 1.5:1 because it is limited by the pull-in effect; it also provides a nonlinear capacitance tuning response. On the other hand, the comb drive structure provides better linearity, suppresses the effect of pull-in, and enhances the tuning range beyond the 1.5 limit as present in the parallel plate type. However, in order to obtain usable capacitances, a very large area of the chip/die must be consumed which is not always possible in current technology where the real estate on wafers is very expensive.

SUMMARY

Embodiments of the present disclosure provide various microelectromechanical system (MEMS) variable fractal capacitors. For example, by building a suspended (movable) fractal pattern on a top layer and a complementary (fixed) fractal pattern on a lower layer, and by applying a DC voltage on the two layers to create the electrostatic force, the top suspended plate will move towards the bottom fixed plate. As such, the capacitance can be tuned to a desired value.

For embodiments of MEMS variable capacitors of the present disclosure, the capacitive device does not require any special MEMS processes. It is possible to fabricate the device in most standard MEMS processes available without any fabrication intervention or post processing. This is very beneficial cost wise. Further, the capacitive device solves theoretically the pull-in effect. Additionally, the capacitive device suppresses the parasitic effects considerably because the top plate layer is built as far as possible from the substrate, and because the area of the bottom fixed plate is reduced significantly. An exemplary embodiment of the capacitive device also provides linear tuning behavior. The above-mentioned advantages are summarized in the following table ("Table 1").

TABLE 1

| Criterion | Present MEMS Fractal Variable Capacitor | MEMS Parallel Plate Variable Capacitor | MEMS Comb Drive Variable Capacitor |
| --- | --- | --- | --- |
| DC Voltage Actuation Requirement | Relatively High | Reasonable | High |
| Linearity | Linear | Nonlinear | Linear |
| Parasitics | Low | High | Reasonable |
| Effect of Pull-In | Eliminated | Present | Reduced |
| Tuning Range | High | Reasonable | High |
| Area Utilization | Reasonable | Reasonable | High |
| Warping Effect | Advantageous | Disadvantageous | Disadvantageous |

Referring now to linearity and Table 1, when the top plate is moving towards the bottom plate, the capacitance changes. In the case of a MEMS parallel plate variable capacitor, the capacitance changes in a nonlinear manner. In contrast, for the MEMS variable fractal capacitor, the changing capacitance is linear.

In Table 1, the parasitic capacitance is shown to be lower for the MEMS fractal variable capacitor than both the parallel plate variable capacitor and the comb drive variable capacitor. Also, the effect of pull-in phenomenon is compared. A benefit of fractal shapes is due to the complementary nature of the two plates, they will never touch each other. For instance, referring to FIG. 2, one can see that the top layer and the bottom layer in terms of shapes are complementing each other. Theoretically, if one were to lay out the top layer and the bottom layer on the same plane, one would end up with a typical square sheet. During a pull-in phenomenon, in such a case, the worse that can happen is that the top layer touches the black floor (i.e. substrate) that is under the bottom plate of the capacitor. Accordingly, the top layer would go through the void within the bottom layer without touching it. In one embodiment, there are a couple of micrometers, for example 3 micrometers of separation, all around the shape so that they do not touch each other when the top plate is moving. Note also that it is possible for the bottom plate to be suspended a certain distance above the substrate, and it could also be residing directly on the substrate. The former will have less parasitics than the latter.

Referring back to Table 1, another criteria that governs how good/bad a variable capacitor is, is the ratio of the maximum achievable capacitance and the minimum achievable capacitance. The ratio may be referred as the tuning range (TR) and is generally desired to be as large as possible. In a select embodiment of the MEMS fractal variable capacitor, the tuning range is high as compared to the parallel plate variable capacitor and the comb drive variable capacitor.

An additional criterion is area utilization. In the fractal case, the area utilization is reasonable. In other words, a large area is not needed. Whereas with the comb drive capacitor, a very large area may be needed to get usable capacitance.

A further criterion is warping effect. In some MEMS processes, but not all, a step called annealing is performed to suppress the warping of the layers. Annealing may eliminate the warping completely or suppress it. In the parallel plate and comb drive types, the warping effect is not desired; as such, the annealing step is important for these two types of variable capacitors. However, if a specific process does not perform annealing, then the fractal type capacitor will warp and the minimum capacitance is reduced and in turn, the tuning range is increased. Hence, the warping effect is indeed advantageous in the MEMS fractal variable capacitor as opposed to the MEMS parallel plate or comb drive variable capacitors. Not having an annealing step in fabrication also contributes in reducing cost.

An embodiment of a variable capacitor of the present disclosure includes a capacitor body in a microelectromechanical system (MEMS) structure, wherein the capacitor body has an upper movable plate with a fractal shape separated by a vertical distance from a lower fixed plate with a complementary fractal shape. Such a variable capacitor further includes a substrate above which the capacitor body is suspended.

Various embodiments of the variable capacitor may include one or more of the following features. The fractal shape of the upper movable plate and the complementary fractal shape of the lower fixed plate may comprise a Moore's Fractal. The variable capacitor may further include a suspension structure supporting suspension of the upper movable plate above the lower fixed plate. The suspension structure, for example, may be a straight suspension structure or a meander suspension structure. Also, a specification of the suspension structure may be configurable to tune a capacitance ratio of the fractal variable capacitor to a desired value. A voltage applied to the upper movable plate may cause the upper movable plate to move closer to the lower fixed plate thereby causing the vertical capacitance between the upper movable plate and the lower fixed plate to be changed. The changing capacitance may be linear. The upper movable plate of the fractal capacitor may include a signal terminal and the lower fixed plate may include a ground terminal. The fractal variable capacitor may further include a horizontal separation between the top movable plate and the bottom fixed plate. For example, the horizontal separation may preferably be substantially 2 μm.

In accordance with the present disclosure, in an embodiment a method is provided that includes fabricating a bottom fixed plate having a fractal shape over a substrate; fabricating a top movable plate, the top movable plate having a fractal shape that is complementary to the fractal shape of the bottom fixed plate; and suspending the top movable plate over the bottom fixed plate within a MEMS variable capacitor. For such a method, a voltage applied to the top movable plate causes the top movable plate to move closer to the bottom fixed plate thereby causing a vertical capacitance between the top movable plate and the bottom fixed plate to be changed. Various embodiments of the method may include one or more of the following features. The fractal shape of the top movable plate and the complementary fractal shape of the bottom fixed plate may comprise a Moore's Fractal. The top movable plate may be suspended over the bottom fixed plate by a suspension structure, wherein a specification of the suspension structure is provided that is configurable to allow tuning a capacitance ratio of the MEMS variable capacitor to a desired value. The suspension structure may be a straight suspension structure or a meander suspension structure. The method may further include a step of applying the voltage to the top movable plate thereby causing the top movable plate to move closer to the bottom fixed plate thereby causing the vertical capacitance between the top movable plate and the bottom fixed plate to change. For example, the changing capacitance may be linear. The top movable plate may be provided including a signal terminal and the bottom fixed plate including a ground terminal. The method may further include maintaining a horizontal separation between the top movable plate and the bottom fixed plate within the MEMS variable capacitor.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

In the following, figures are introduced to explain the fractal concept and the present design. Embodiments of the present disclosure are not limited to the design shown in the figures, since there are many variations that could be included and are contemplated. For example, these variations can be within the structure or the suspension, the separation distance between the top and bottom plate, lateral separation distance, etc.

Embodiments of the present disclosure comprise a microelectromechanical system (MEMS) variable fractal capacitor. In accordance with the present disclosure, one embodiment of a fractal variable capacitor (varactor) comprises a capacitor body in a microelectromechanical system (MEMS) structure, wherein the capacitor body has an upper first metal plate with a fractal shape separated by a vertical distance from a lower first metal plate with a complementary fractal shape; and a substrate above which the capacitor body is suspended.

Figure 1:
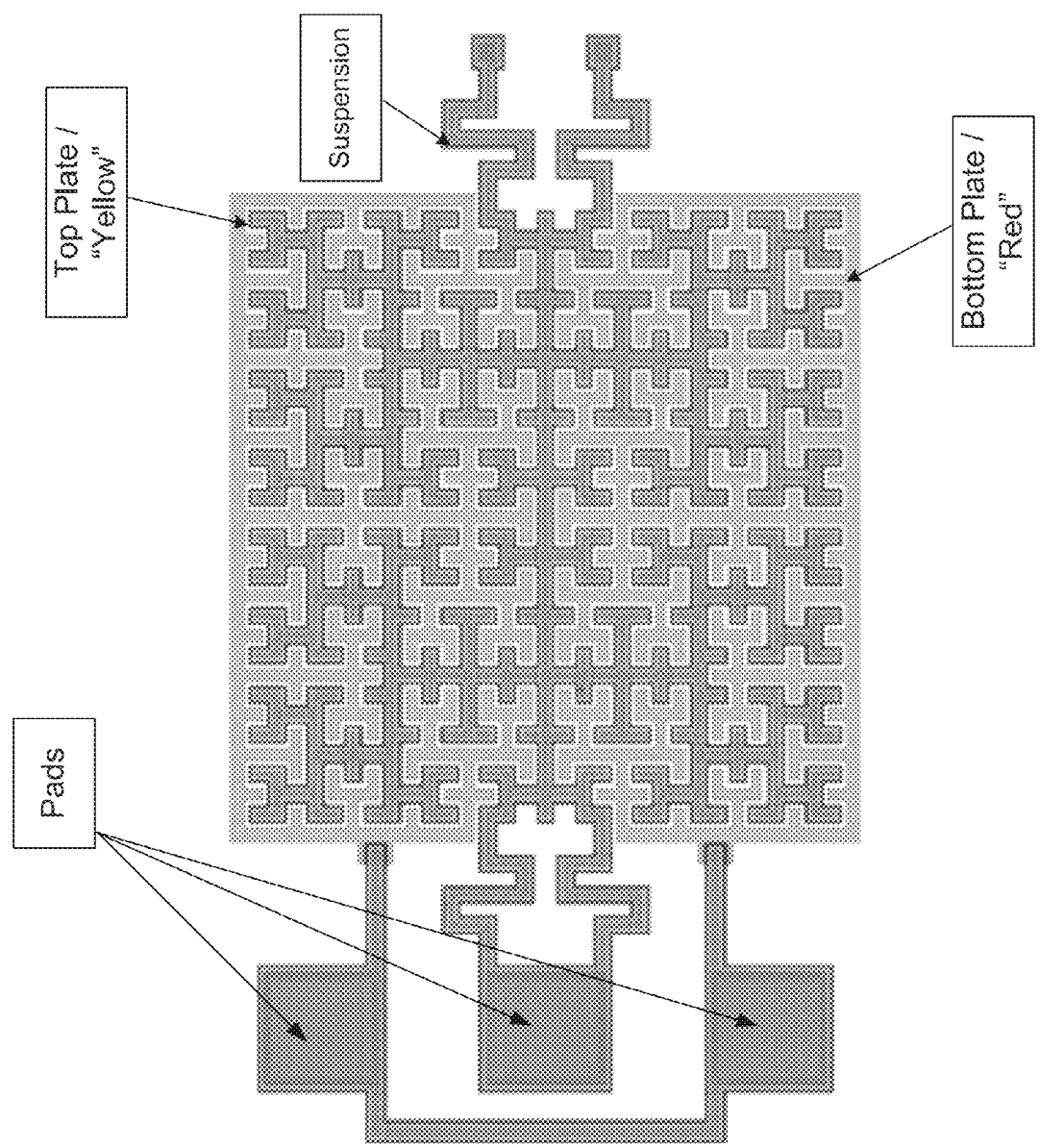
FIG. 1 is a diagram of a layout of an exemplary embodiment of a MEMS variable fractal capacitor in accordance with the present disclosure.

Referring now to FIG. 1, a layout of an embodiment of the MEMS variable fractal capacitor is depicted. The layer labeled "red" is the bottom fixed plate; the layer labeled "yellow" is the top suspended (movable) plate which is suspended by four suspension arms looking like meanders; and three measurement pads are on the left. It is noted that the meander shape could be replaced with a straight suspension for example or any other suspension design as desired, in other embodiments.

Figure 2:
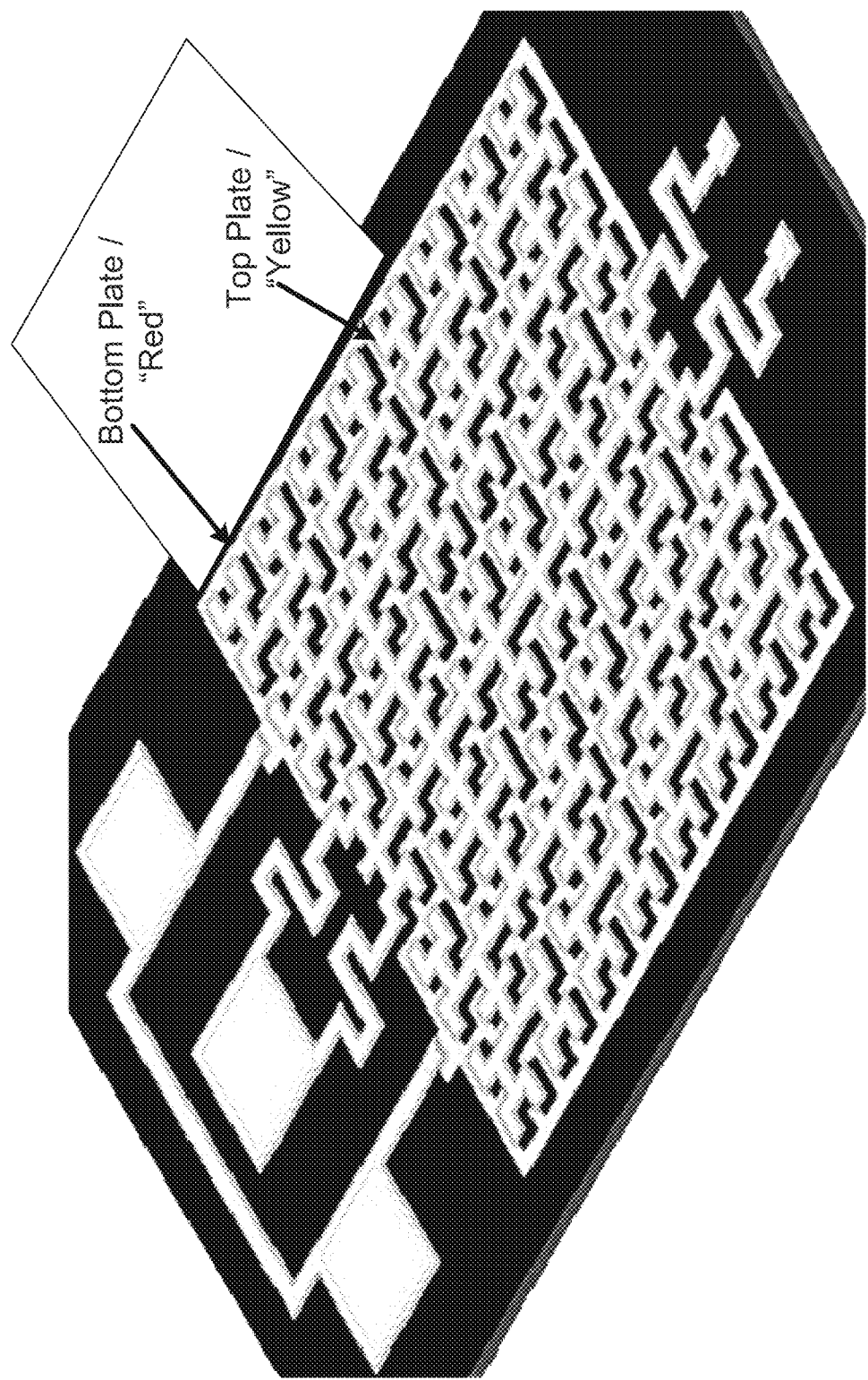
FIG. 2 is a diagram of an isometric view of the MEMS variable fractal capacitor of FIG. 1.

In FIG. 2, an isometric view of the capacitor is shown, where the top plate (labeled yellow) is the 'signal' terminal and the bottom plate (labeled red) is the 'ground' terminal. A close up of the capacitor in FIG. 2 is also shown in FIG. 3.

Figure 3:
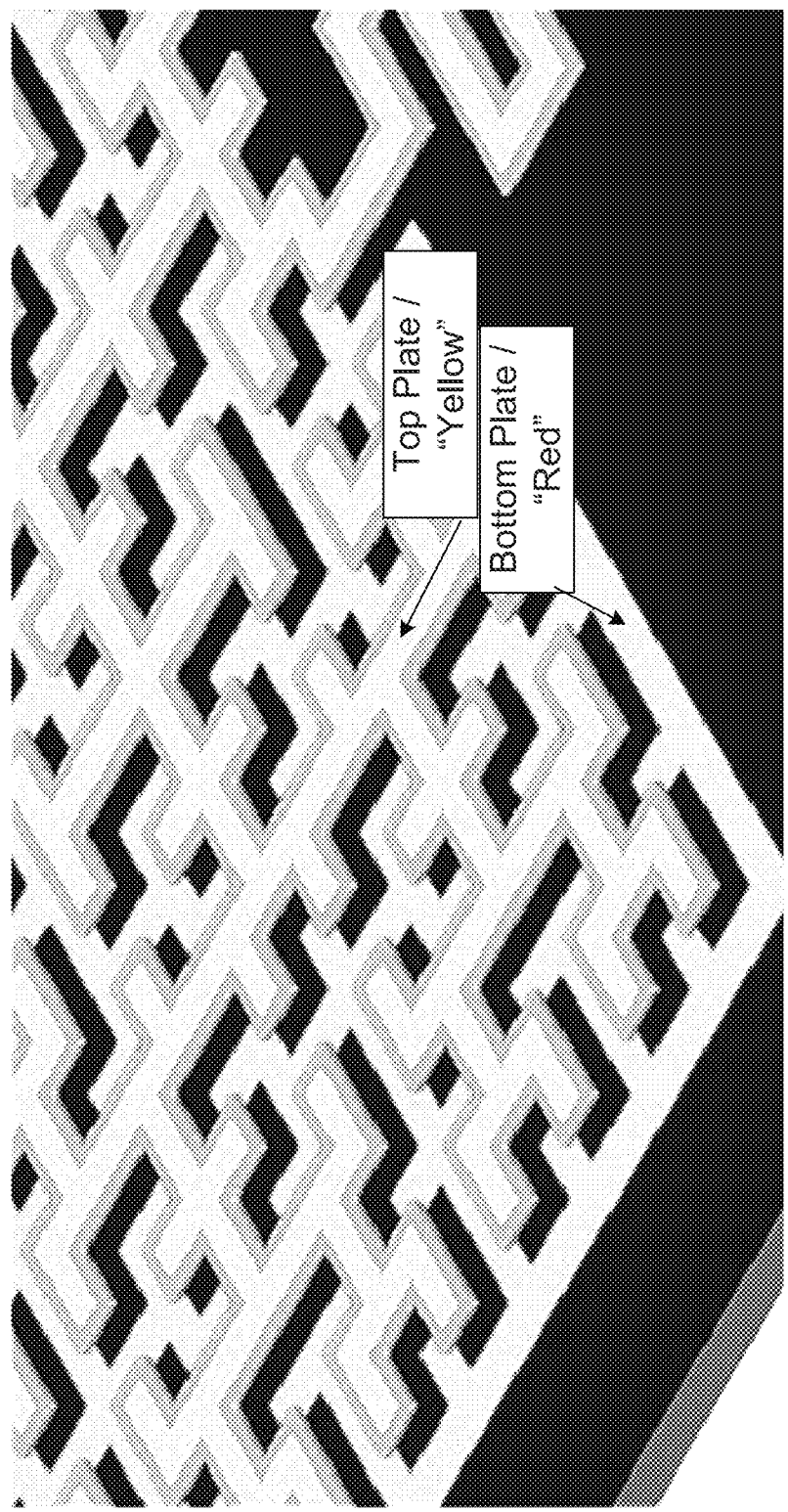
FIG. 3 is a diagram of a close up view of the MEMS variable fractal capacitor of FIG. 2.

In FIG. 3, there is top layer fractal labeled yellow and a bottom layer fractal labeled red. The shape of the red fractal layer is a complement of the shape of the yellow fractal layer one. These are two layers completely different from each other. From the figure, it is apparent how the top plate is suspended over the bottom plate. Therefore, a static voltage may be applied over the top layer causing the whole top layer to move down, allowing for different values of capacitance. This benefit is not readily available in CMOS (Complimentary Metal-Oxide-Semiconductor) technology.

Figure 4:
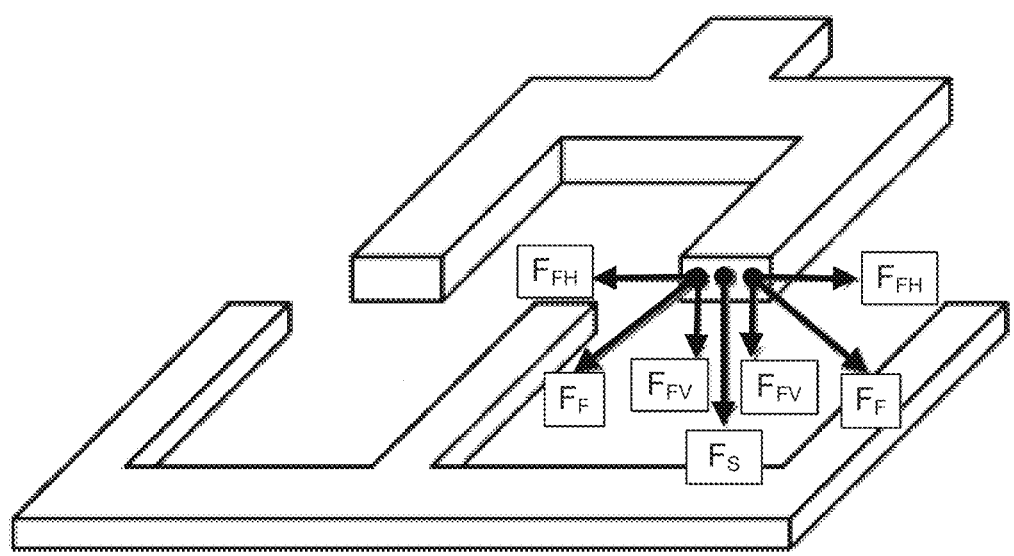
FIG. 4 is a schematic diagram of a partial exemplary embodiment of a MEMS variable fractal capacitor in accordance with the present disclosure.

The basic principle of operation of electrostatic fractal MEMS variable capacitors (MVCs) is explained with the aid of FIG. 4, in which a conceptual schematic is provided comprising a small portion of the Moore's Fractal similar to that shown in FIG. 3. The Moore's Fractal is described at H. Sagan, Space-filling curves vol. 2: Springer-Verlag New York, 1994 and is incorporated herein in its entirety.

As mentioned earlier, when a potential difference is applied, a representative electrostatic vector force is generated between both plates due to the fringing capacitance present between these two plates, and this force is referred as $F_F$, as shown in FIG. 4. Similarly, another electrostatic force is generated between the top plate and the substrate, is referred as force F. However, $F_F$ can be de-composed into two forces, namely a horizontal force ($F_{FH}$) and a vertical force ($F_{FV}$). Note that $F_F$ shown in figure can be in any direction, but a single case is being shown for illustration purposes only. Due to symmetry, all the horizontal forces would theoretically cancel each other out, and only the vertical forces would contribute to the movement of the top plate, i.e. $F_{FV}$ and $F_S$. Practically nonetheless, and due to fabrication imperfections, the horizontal forces will not be exactly equal. However, these imperfections are not severe to the extent that they cause a real concern. Further, the suspension arms are designed such that they would be very stiff in the direction of these horizontal forces but not as stiff in the direction of the vertical forces, and the variable capacitor is also designed with a horizontal separation of 2 μm present between both plates. Hence, and as indicated in FIG. 4, no matter how high the actuation voltage reaches, the top plate would never touch the bottom plate.

By taking a close look at FIG. 4, one can expect that $F_F$ and $F_S$ will eventually cause the top plate to collide with the nitride layer. The middle part of the plate will be the first to collapse because it will not be as warped as the outer parts of the plate (details will follow shortly). As the voltage increases further, a zipping motion will take place and the capacitance will continue to increase until the top plate is in complete contact with the substrate. The latter can be easily understood by visualizing two puzzle pieces coming together to form one bigger piece. At a first glance, one may be tempted to ignore the effect of F. However, it has been demonstrated experimentally that the substrate effects in PolyMUMPS on actuation are significant, and as such, ignoring $F_S$ is not a reasonable assumption.

It is possible to create the variable capacitor without the need for the bottom plate. However, the presence of the bottom plates provides two important advantages. First, it creates additional fringing capacitance, which results in creating an electrostatic force and subsequently lowers the required actuation voltage. Secondly, the second plate contributes in increasing the maximum capacitance, i.e. when the top plate becomes completely in contact with the substrate.

Another factor to consider is the warping that will take place due to residual stresses. This warping will cause the initial capacitance to decrease and hence, the TR will increase. By taking a close look at FIG. 5A, it is clear how the outer parts of the top plate are warped upwards more than the middle parts of the plate. To obtain more information on this warping, a detailed optical profilometer analysis with the aid of the Zygo 7300 optical profiler is presented below.

Figure 5A:
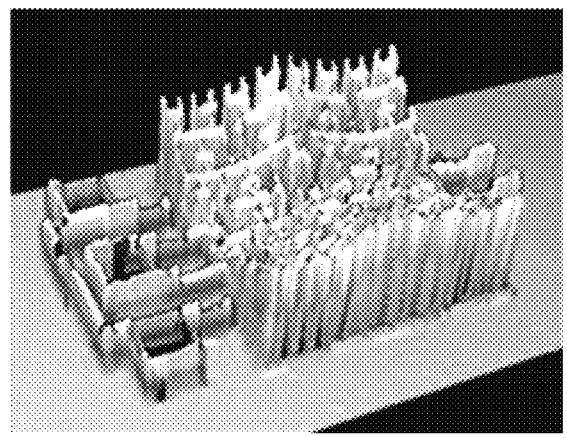
FIG. 5A is a diagram of a 3D oblique view of an optical profile analysis of an exemplary embodiment of a MEMS variable fractal capacitor in accordance with the present disclosure.
Figure 5B:
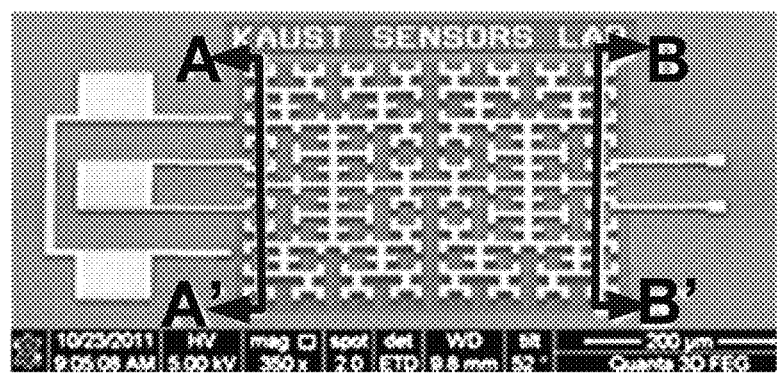
FIG. 5B is a scanning electron microphotograph of an exemplary embodiment of a MEMS variable fractal capacitor in accordance with the present disclosure.
Figure 5C:
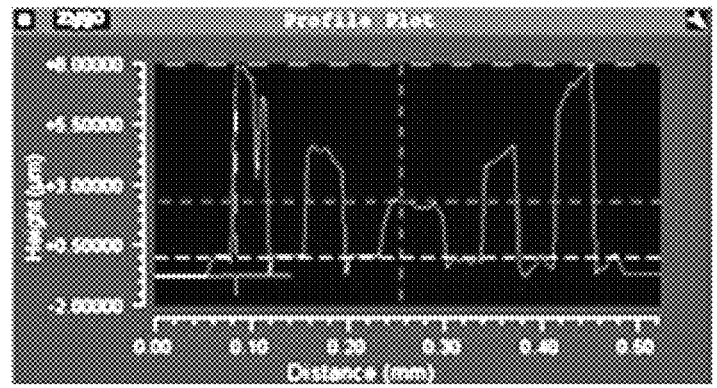
FIGS. 5C-5D are diagrams of measurements of warping between sections of the MEMS variable fractal capacitor of FIG. 5B.
Figure 5D:
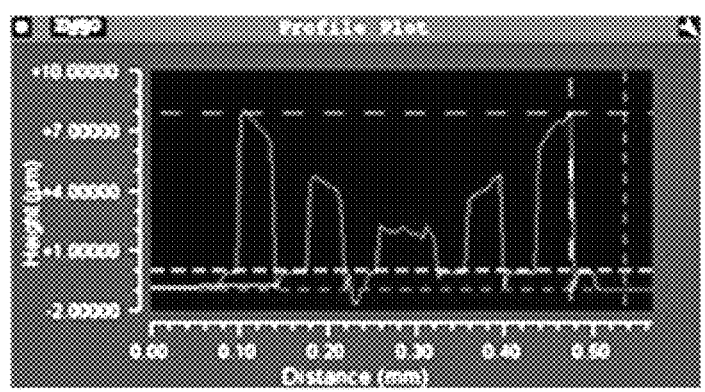

FIG. 5A shows a 3D oblique profile plot of one exemplary embodiment of a variable capacitor, which clearly shows the warping that takes place. To quantify this warping, two cross sections for the variable capacitor, i.e. AA' and BB' as shown in FIG. 5B, are obtained and the surface profile plot for these sections are provided in FIG. 5C and FIG. 5D. Explicitly, FIG. 5C shows the AA' surface profile and indicates that the warping distance between the outer and middle parts of the plate is 5.6 μm. On the other hand, FIG. 5D measures how far the outer parts of the plates are from the substrate, and this distance is 8.8 μm.

FIGS. 5A-5D affirm the analysis presented in the previous section (i.e. zipping behavior). Because the middle parts of the top plate are closest to the substrate, they will be the first to collapse onto the substrate. Then, as the actuation voltage increases, the rest of the plate starts to flatten out until the complete plate rests on the substrate in a zipping manner.

From the previous optical profiler images, one can deduce that the middle part of the plate is 8.8 μm-5.6 μm=3.2 μm above the substrate. However, note that the distance of 3.2 μm accounts also the Poly2+ metal thickness of 2 μm. As such, the sacrificial oxide thickness is approximately 1.2 μm as expected.

Figure 6:
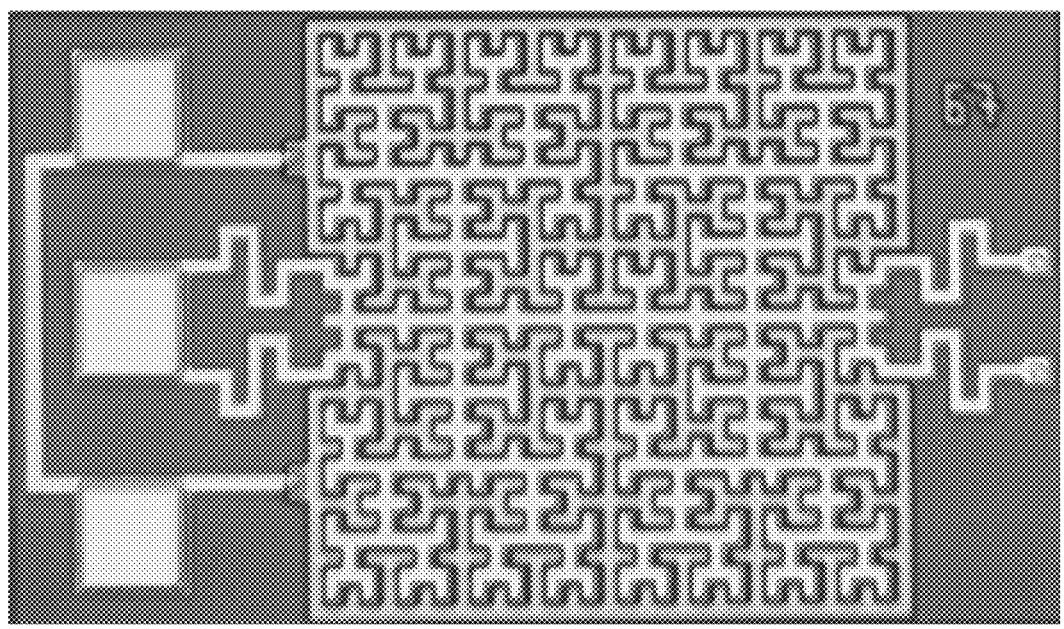
FIGS. 6-7 are scanning electron microphotographs of exemplary embodiments of a MEMS variable fractal capacitor in accordance with the present disclosure.
Figure 7:
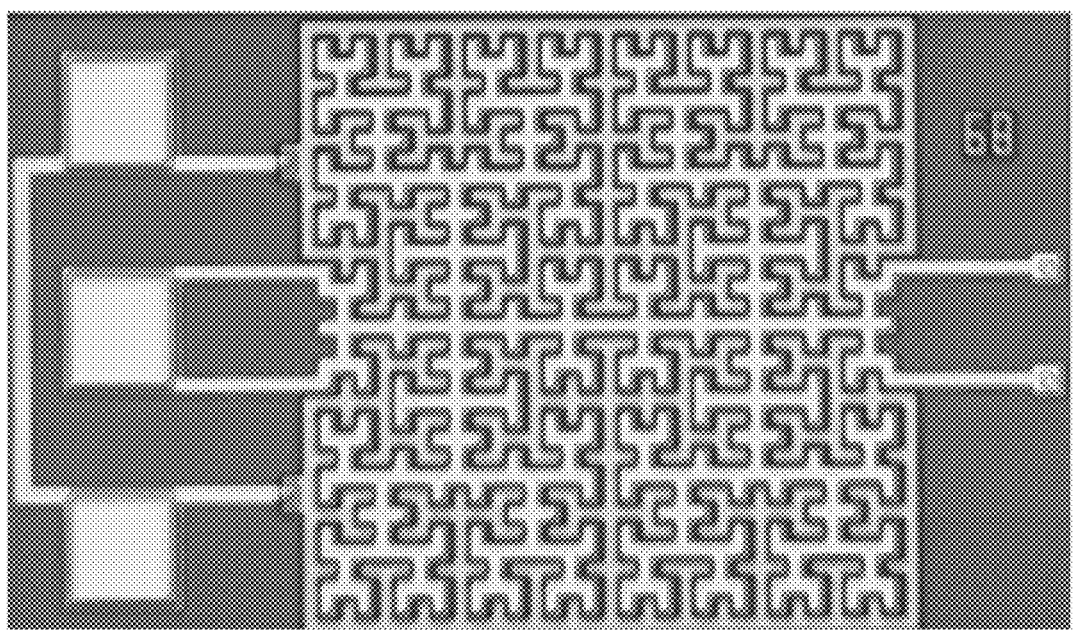

A microphotograph of an embodiment of the designed MEMS variable capacitor is shown in FIG. 6. Next, in FIG. 7, a microphotograph of another embodiment of the variable capacitor is depicted. The only difference between FIGS. 6 and 7 is the suspension structure. In FIG. 6, a meander suspension is featured, whereas in FIG. 7, a straight suspension is featured. With different suspension structures, embodiments of the variable capacitor can have lower actuation voltages, higher actuation voltages, less tuning range, higher tuning range, etc. By adjusting or configuring specifications of the suspension structure, one can tune the capacitance ratio and the capacitance value to a desired value.

The MEMS devices described herein can be fabricated using any known micromachining processes, for example, the multi-user MEMS processes (MUMPs) described in the PolyMUMPs Design Handbook, Revision 10.0, by David Koester et al., MEMSCAP 2003. One MUMPs process provides three-layers of conformal polysilicon that are etched to create a desired physical structure. The first layer, designated Poly0, is coupled to a supporting wafer, and the second and third layers, Poly1 and Poly2, respectively, are mechanical layers that can be separated from underlying structure by the use of sacrificial layers of deposited Oxide that separate layers and are removed during the process. A layer of silicon nitride is used to electrically isolate the substrate from the layers of polysilicon. A metal layer, such as, for example, gold, can be applied over the upper polysilicon layer. Details of the materials, layer thicknesses, tolerances, and the like can be found in the PolyMUMPs Design Handbook.

Therefore, in accordance with embodiments of the present disclosure, there are two sacrificial (oxide) layers in the PolyMUMPS process, i.e. Oxide1 and Oxide2, which are 2 µm and 0.75 µm thick, respectively, and PolyMUMPS allows some flexibility in designing structures that depend on these oxide layers.

For the cases of the MEMS variable capacitor (MVC) herein for example, it is possible to create the top plate over both oxide layers, in which case the separation between the top plate and the substrate would be 2.75 µm. It is also possible to partially etch Oxide1 by 0.75 µm before depositing Oxide2 atop Oxide1. The latter case would result in making the top plate reside 2 µm above the substrate. Another possible combination to use is to etch the combined thickness of 2.75 µm to bring it down to approximately 1.25 µm. Other possibilities are also achievable and contemplated in various embodiments.

Depending on the initial separation between the top plate and the bottom plate, the minimum capacitance changes. As such, the tuning range changes as well assuming that the maximum capacitance should always, theoretically, stay constant. If the top plate is far from the bottom plate, then the minimum capacitance becomes smaller, which increases the TR. On the other hand, if the top plate is close to the bottom plate, then the minimum capacitance becomes larger, which decreases the TR. However, the higher TR will come at the cost of a higher actuation voltage and it is up to the designer to choose what is more suitable for the application considered.

In one embodiment, the actuation voltage requirement is prioritized rather than the TR, because the actuation voltage requirement is very compelling in wireless handheld devices. Consequently, and with the previous explanation in mind, the combination is selected that provides the minimum oxide thickness and achieves an oxide thickness of 1.2 µm, in one embodiment.

Figure 8:
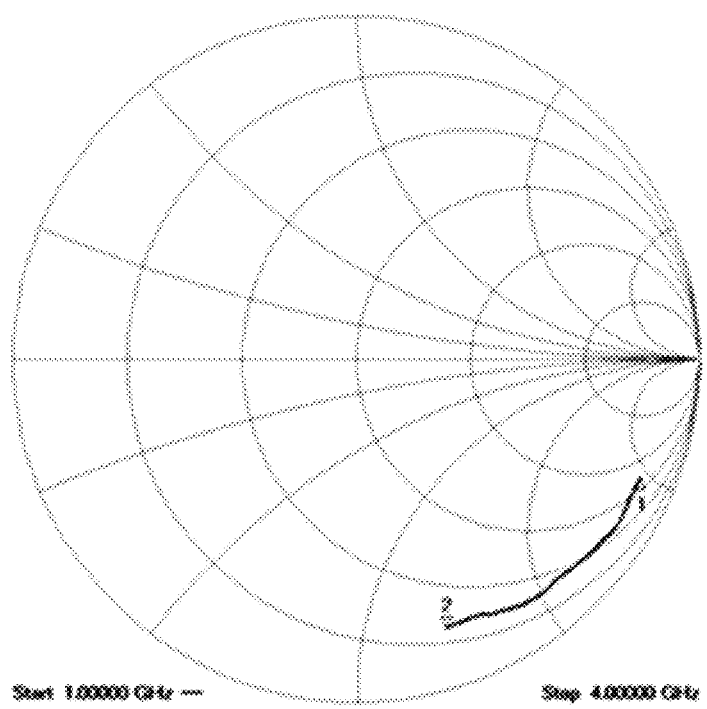
FIG. 8 is a diagram of a return loss measurement from 1 GHz to 4 Ghz of an exemplary embodiment of a MEMS variable fractal capacitor in accordance with the present disclosure.

Referring now to FIG. 8, measurements were performed at a frequency of 1 GHz. FIG. 8 shows the return loss measurement (i.e. $S_{11}$) of the capacitor shown in FIG. 7 from 1 GHz up to 4 GHz, where the quality factor (Q) is approximately 5 throughout the frequency band.

Figure 9:
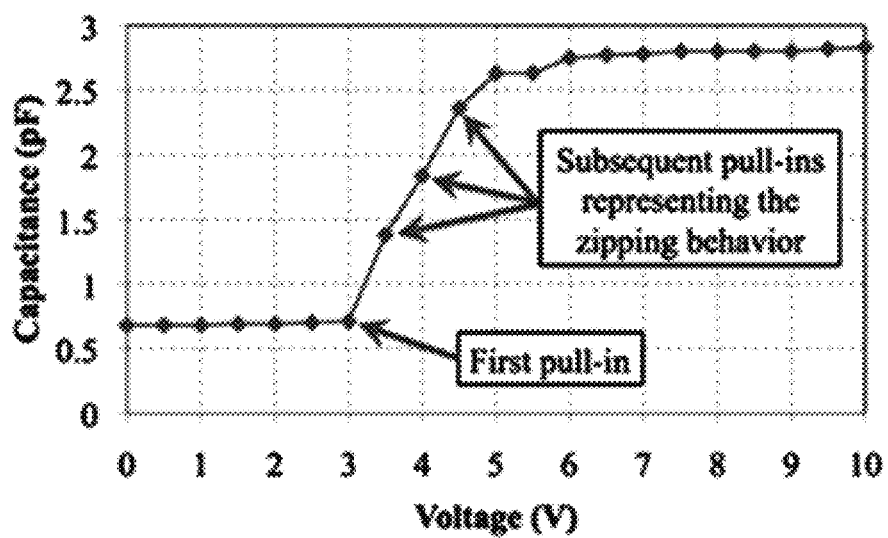
FIGS. 9-10 are diagrams of measurements of tuning range of an exemplary embodiment of a MEMS variable fractal capacitor in accordance with the present disclosure.

FIG. 9 also shows the tuning characteristics. The attained TR was 4.1 and was reached at a voltage of 6V, and no change in capacitance takes place beyond this voltage. By taking a close look at FIG. 9, one can conclude that the first pull-in occurs at 3V. After the first pull-in occurs at 3V, multiple consequent pull-ins also occur, until the maximum capacitance is reached at approximately 6V. These measurements are inline with the expected behavior of zipping.

As stated above, one notices that the capacitor experiences the first pull-in at a voltage of approximately 3V and little tunability is available. By exploiting a more suitable suspension design, the performance of this capacitor can be enhanced. FIG. 6 shows a scanning electron microphotograph (SEM) of a fractal capacitor that is identical to that shown in FIG. 7 in every aspect except for the suspension configuration supporting the top plate. The suspension arms that hold the capacitor in FIG. 7 are simple beams whereas those in FIG. 6 are of a serpentine or meander shape, which are less stiff than the typical design shown in FIG. 7.

The spring constant of both configurations can be easily calculated through solid mechanics. Because the serpentine suspension (SS) configuration is less stiff than the first design presented with a typical suspension (TS), it is expected that the top plate in the SS variable capacitor will deflect more than the top plate in the TS under the effect of its own mass. As such, the minimum (initial) capacitance will be higher in the SS variable capacitor when compared to the TS variable capacitor. On the other hand, it is expected that the maximum capacitance should not change in either designs because the final state of both capacitors will be the same irrespective of the suspension used. Consequently, the TR of the SS variable capacitor should also be lower.

Another benefit that should also be possible to acquire from using the SS, is suppressing the abrupt change in capacitance caused by pull-in and zipping. Because the top plate is closer to the substrate, this translates to having only a small distance to travel when compared to the TS structure. However, using the SS structure increases the series resistance and in turn decreases Q.

Figure 10:
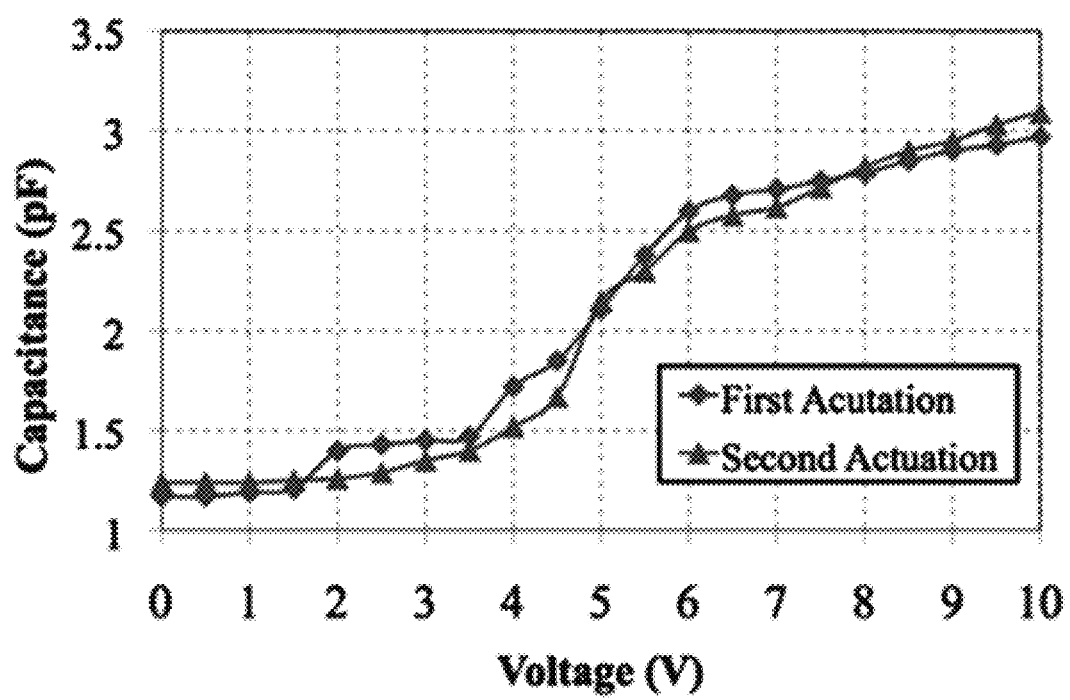

The tuning behavior of the enhanced variable capacitor is shown in FIG. 10 and corresponds to a tuning range of 2.5. For reliability purposes, the actuation was performed twice, and as can be seen, the capacitance-voltage behavior in both cases is very similar. The Q was also measured and was 4 at 1 GHz.

With embodiments of the present disclosure utilizing MEMS variable capacitors, the pull-in effect is eliminated completely (as discussed above). The structure relies on the fractal geometry that is created on two different layers within a MEMS process. One of the layers contains a specific fractal shape that is fixed, and the other layer contains the complement to the shape in the first layer, and is also suspended. Upon applying a DC voltage difference across these two layers, the suspended layer will move towards the fixed plate—However, the two layers will not snap-in and will not short out because the shapes are complements of each other.

In an exemplary embodiment of a method in accordance with the present disclosure, a top suspended plate is created such that it follows a specific fractal shape. At the same time, a bottom fixed plate is created using a fractal shape that is complementary to the top one. In other words, nowhere does the bottom plate exist under the top plate and nowhere does the top plate exist over the bottom plate. As such, no matter how far the top plate travels towards the bottom plate, the maximum that would happen is for the top plate to collide with the nitride insulator layer that is above the substrate without touching the bottom plate. When this latter case occurs, all the void area that is present within the bottom plate will be filled with the top plate similar to how a jigsaw puzzle is formed.

The source of the electrostatic forces is two-fold: the fringing capacitance that is present between the top plate and the bottom plate, and the capacitance that is present between the top plate and the semiconducting substrate. By using both the fractal concept and substrate coupling, a variable capacitor with high tuning range is attainable.

It should be emphasized that the above-described embodiments of the present disclosure are merely possible examples of implementations, merely set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure.

It should be noted that ratios, percentages, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a percentage range of "about 0.1% to about 5%" should be interpreted to include not only the explicitly recited percentage of about 0.1% to about 5%, but also include individual percentages (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

The invention claimed is:

1. A variable capacitor comprising:
    a capacitor body in a microelectromechanical system (MEMS) structure, wherein the capacitor body has an upper movable plate with a fractal shape separated by a vertical distance from a lower fixed plate with a complementary fractal shape; and
    a substrate above which the capacitor body is suspended.

2. The variable capacitor of claim 1, wherein the fractal shape of the upper movable plate and the complementary fractal shape of the lower fixed plate comprise a Moore's Fractal.

3. The variable capacitor of claim 1, further comprising:
    a suspension structure supporting suspension of the upper movable plate above the lower fixed plate.

4. The variable capacitor of claim 3, wherein the suspension structure comprises a straight suspension structure or a meander suspension structure.

5. The variable capacitor of claim 3, wherein a specification of the suspension structure is configurable to tune a capacitance ratio of the variable capacitor to a desired value.

6. The variable capacitor of claim 1, wherein a voltage applied to the upper movable plate causes the upper movable plate to move closer to the lower fixed plate thereby causing a capacitance between the upper movable plate and the lower fixed plate to be changed.

7. The variable capacitor of claim 1, wherein the upper movable plate comprises a signal terminal and the lower fixed plate comprises a ground terminal.

8. The variable capacitor of claim 1, further comprising a horizontal separation between the upper movable plate and the lower fixed plate, the horizontal separation being substantially 2 µm.

9. The variable capacitor of claim 1, wherein when a voltage is applied across the upper movable plate and the lower fixed plate, the upper movable plate moves toward the substrate, and as the voltage increases, a capacitance of the capacitor body increases.

10. The variable capacitor of claim 1, wherein a pull-in effect between the upper movable plate and the lower fixed plate, characterized by an abrupt change in capacitance caused by the pull-in, is avoided at least in part because the fractal shape of the upper movable plate and the complementary fractal shape of the lower fixed plate do not touch each other when a voltage is applied across the upper movable plate and the lower fixed plate.

11. A method comprising:
    fabricating a bottom fixed plate having a fractal shape over a substrate;
    fabricating a top movable plate, the top movable plate having a complementary fractal shape that is complementary to the fractal shape of the bottom fixed plate; and
    suspending the top movable plate over the bottom fixed plate within a MEMS variable capacitor, the MEMS variable capacitor having a capacitance between the top movable plate and the bottom fixed plate, where a voltage applied to the top movable plate causes the top movable plate to move closer to the bottom fixed plate thereby causing a change in the capacitance.

12. The method of claim 11, wherein the fractal shape of the top movable plate and the complementary fractal shape of the bottom fixed plate comprise a Moore's Fractal.

13. The method of claim 12, further comprising maintaining a horizontal separation between the top movable plate and the bottom fixed plate within the MEMS variable capacitor.

14. The method of claim 11, wherein the top movable plate is suspended over the bottom fixed plate by a suspension structure, wherein a specification of the suspension structure is configurable to tune a capacitance ratio of the MEMS variable capacitor to a desired value.

15. The method of claim 14, wherein the suspension structure comprises a meander suspension structure.

16. The method of claim 11, wherein the change in the capacitance of the MEMS variable capacitor is substantially linear.

17. The method of claim 12, wherein the top movable plate comprises a signal terminal and the bottom fixed plate comprises a ground terminal.

18. The method of claim 11, wherein the bottom fixed plate is suspended a distance over the substrate.

19. The method of claim 11, wherein the top movable plate deflects as it moves closer to the bottom fixed plate.

20. The method of claim 11, wherein the top movable plate deflects into contact with the substrate, where the top movable plate makes progressively increasing contact with the substrate as the voltage is increased.

* * * * *